United States Patent
Musicus et al.

[11] Patent Number: 5,983,255
[45] Date of Patent: Nov. 9, 1999

[54] DIGITAL FILTER AND CONTROL SYSTEM EMPLOYING SAME

[75] Inventors: Bruce R. Musicus, Arlington; Robert D. Preuss, Boston, both of Mass.

[73] Assignee: GTE Internetworking Incorporated, Burlington, Mass.

[21] Appl. No.: 08/963,717

[22] Filed: Nov. 4, 1997

[51] Int. Cl.⁶ ............................ G06F 17/10; G05B 21/02
[52] U.S. Cl. .............................................. 708/300; 364/178
[58] Field of Search ................ 364/724.011, 724.16, 364/724.19, 726.01, 726.02, 724.17, 178

[56] References Cited

U.S. PATENT DOCUMENTS 5,524,149  6/1996  Frenzel ............................... 364/724.19
5,623,402  4/1997  Johnson .............................. 364/724.19

*Primary Examiner*—Tan V. Mai
*Attorney, Agent, or Firm*—Leonard Charles Suchyta; Floyd E. Anderson

[57] ABSTRACT

In the control system disclosed herein, multiple input data streams are processed or filtered to generate multiple output streams by a filter which combines efficient batch processing of a fixed number of older input samples with immediate direct processing of a varying number of current samples thereby to generate multiple output data streams which are based on essentially current input data as well as older input data reaching back for a time interval which varies periodically.

12 Claims, 7 Drawing Sheets

L = 3, K = 5, P = 11

| b | k | 0 | 1 | 2 | 3 | 4 | 5 | 6 | 7 | 8 | 9 | 10 |
|---|---|---|---|---|---|---|---|---|---|---|---|----|
| 1 | 0 | F10 | F9  | F8  | F7  | B6  | B5  | B4  | B3  | B2  | B1  | B0  |
| 1 | 1 | F11 | F10 | F9  | F8  | F7  | B6  | B5  | B4  | B3  | B2  | B1  |
| 1 | 2 | F12 | F11 | F10 | F9  | F8  | F7  | B6  | B5  | B4  | B3  | B2  |
| 1 | 3 | F13 | F12 | F11 | F10 | F9  | F8  | F7  | B6  | B5  | B4  | B3  |
| 1 | 4 | F14 | F13 | F12 | F11 | F10 | F9  | F8  | F7  | B6  | B5  | B4  |
| 2 | 0 | F15 | F14 | F13 | F12 | B11 | B10 | B9  | B8  | B7  | B6  | B5  |
| 2 | 1 | F16 | F15 | F14 | F13 | F12 | B11 | B10 | B9  | B8  | B7  | B6  |
| 2 | 2 | F17 | F16 | F15 | F14 | F13 | F12 | B11 | B10 | B9  | B8  | B7  |
| 2 | 3 | F18 | F17 | F16 | F15 | F14 | F13 | F12 | B11 | B10 | B9  | B8  |
| 2 | 4 | F19 | F18 | F17 | F16 | F15 | F14 | F13 | F12 | B11 | B10 | B9  |

FIG. 5

DIGITAL FILTER AND CONTROL SYSTEM EMPLOYING SAME

BACKGROUND OF THE INVENTION

The present invention relates to digital filters and more particularly to a digital filter which will efficiently process one or more input data streams to generate one or more output data streams on a real time basis so as to be useful in low latency dynamic control systems.

In active vibration and noise control systems it is desirable to control one or more output actuators as a complex function of input signals provided by one or more input sensors. The input signals are typically sampled at preselected equal time intervals, converted to digital form, and then processed by a digital signal processor which provides a preselected transfer function. To be useful in active vibration or sound control, the transfer function must be generated essentially in real time. Typically, the transfer function implemented is a finite impulse response (FIR) filter or an infinite impulse response (IIR) filter and such filters may be characterized by a number of tap weights. As the number of input and output channels increases, however, the amount of computation required increases precipitously and it has heretofore been impractical to implement such multiple input multiple output (MIMO) filters in real time. Even in the case of a single input single output (SISO) filter, the cost of implementing such a filter in real time may be prohibitively large when the number of tap weights is large.

As is understood by those skilled in the art the digital implementation of a filter typically involves calculating the contribution of each of a series of input samples, reaching back for a predetermined time interval, to a current output value. The contributions are typically calculated by multiplying each such sample by a corresponding coefficient. The contributions are then summed. In the context of the present invention, real time filtering is understood to be a generation of an output value in a time essentially comparable to the input sample interval. In other words, the latency of the filter should be of essentially the same order of magnitude as the preselected time-interval between signal samples. In the case of an IIR filter, contributions to current output values are also taken from previous output values as is understood by those skilled in the art.

There are several known techniques for reducing the total number of computations needed to perform transformations of the type required for FIR and IIR filtering but, in these previously known techniques, contributions from a batch of input samples to a batch of output values are calculated simultaneously. While these techniques increase the computational efficiency and reduce the total number of calculations needed for the entire batch, the number of calculations required for each batch is typically much too large to be performed in a single sample interval. A further difficulty is that the entire batch of input samples must arrive before the batch can be processed. Thus, these known techniques necessarily impose a high latency or delay between the earliest input sample and the generation of an output value which draws a contribution from that input sample. Accordingly, these techniques have not been heretofore utilized in real time control systems of the types employed in active vibration and noise control.

Among the objects of the present invention may be noted the provision of a SISO or MIMO digital filter which will operate in real time; the provision of such a filter which is useful in control systems in which one or more actuators are each operated as a function of input samples obtained from one or more sensors; the provision of such a filter which can implement a finite impulse response or an infinite impulse response characteristic; the provision of such a filter which implements an efficient use of computational power; the provision of such a filter which is highly reliable and which is of relatively simple and inexpensive construction. Other objects and features will be in part apparent and in part pointed out hereinafter.

SUMMARY OF THE INVENTION

In accordance with the practice of the present invention, real time filtering of one or more input signals to obtain one or more output signals is implemented by combining contributions from a fixed size batch of older samples with immediately calculated contributions from a variable number of current samples.

Briefly, the system of the present invention generates one or more output data streams as a filtered function of one or more input data streams, each of which comprises samples generated at predetermined intervals. During each interval, an immediate computation is performed using corresponding filter coefficients on a determined number of the most recent samples, thereby to define respective contributions from each of said samples to the current values of the output data streams. The determined number is incremented progressively during successive sample intervals up to a preselected maximum number, L+K, at which point the determined number is reset to the preselected starting value L+1. Over a number of sample intervals which is less than the maximum L+K a computation is performed on a large number of earlier occurring samples from each data stream. As a first step in this computation, a batch of G samples is transformed into what might be termed a conversion domain, e.g. the time domain samples might be converted to the frequency domain. Corresponding filter coefficients are multiplied with each of the conversion domain values and each of the resulting products is summed together with its corresponding product from R−1 previous batches. These sums are then reconverted to time domain data thereby defining a contribution from each of said conversion domain values to a later sequence of data values in each of said output data streams. During each sample interval, contributions to the current output data values from the current determined number of most recent samples are combined with contributions from the previously reconverted domain data thereby to generate output data streams which are based on essentially current input data as well as older input data.

In a presently preferred embodiment of the invention, the contributions from the variable number of current samples is calculated by direct convolution while the contribution from older batches of samples is obtained by converting the time domain samples to a frequency domain, applying corresponding filter coefficients, and reconverting to the time domain.

BRIEF DESCRIPTION OF THE DRAWINGS

FIG. 5 is a chart illustrating the periodic shifting of contributions between direct convolution and domain shifted batch computation;

Corresponding reference characters indicate corresponding parts throughout the several views of the drawings.

DESCRIPTION OF THE PREFERRED EMBODIMENT

Figure 1:
FIG. 1 is a diagram of a control system employing filtering in accordance with the present invention.

FIG. 1 is a generalized diagram of an active control system. Such a system may, for example, be employed to reduce radiated vibration from a piece of machinery, e.g., a motor generator. This system employs multiple sensors, e.g., accelerometers 11, and multiple output transducers or actuators, e.g., voice coil motors 21. The accelerometers 11 sense motion of the machinery along or around the various axes and the actuators 21 are energized by means of digital filter control circuitry, designated generally by reference character 20, to generate forces which tend to cancel the sensed vibrations.

The accelerometers 11 are connected to analog-to-digital (A/D) converters 17 which provide, for each sensing accelerometer, an input data stream comprising digitized samples at predetermined intervals.

A filter 20 computes digital output data streams as a function of these digital input data streams and thereby controls the energization of each output actuator as a function of its respective output data stream. After being converted to analog form in digital-to-analog (D/A) converters 27, the analog output signals are applied to respective power amplifiers which drive the actuators 21. As will be understood, the particular filtering function used will depend upon the particular application. However, the filter will generally be classified as either a FIR or an IIR filter as indicated previously.

Figure 2:
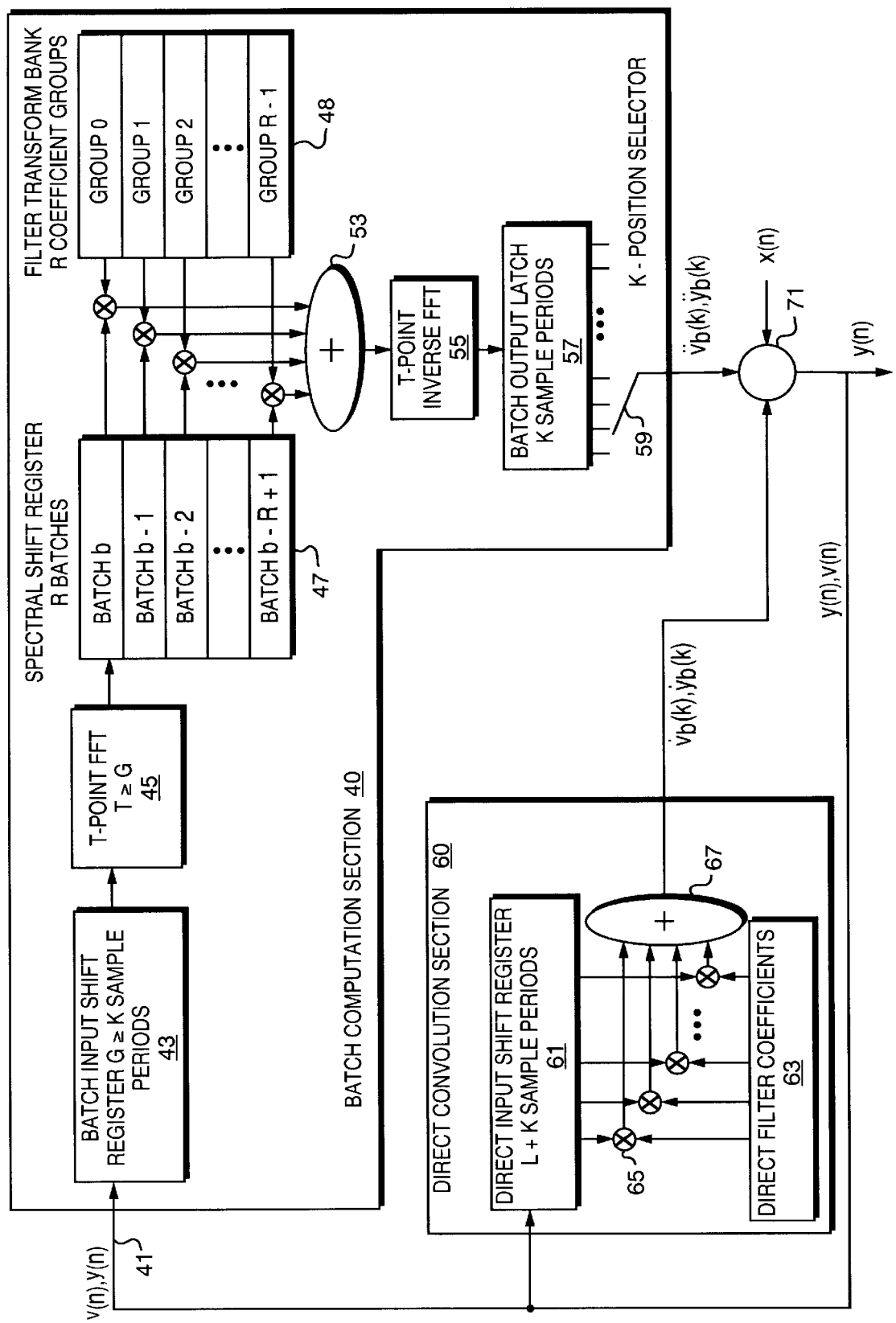
FIG. 2 is a block diagram of a finite impulse response filtering system used in the control system of FIG. 1.

As indicated previously, the filtering system of the present invention achieves the low latency appropriate for real time control systems by combining contributions derived from a fixed batch of older input samples with contributions more immediately derived from a determined number of the most recent samples from each input stream, the determined number being incremented progressively during a series of successive sample intervals. Referring now to FIG. 2, the filter system illustrated there utilizes a batch processing section 40 and an immediate processing or direct convolution section 60. While the functional system can be implemented by means of dedicated or hard wired logic, in most cases the various functions can be efficiently implemented by programming a digital signal processor (DSP) as is understood by those skilled in the art.

A plurality, designated as N, of input data streams are provided as inputs to the filter system illustrated. The collection of N sample values provided at the n-th time instant is designated by x(n) and may be referred to as the n-th input vector. In the batch processing section 40, a batch of vectors at G time instants is collected in memory as indicated at block 43. Once a batch has been collected, a fast Fourier transform is performed, as indicated at block 45, to convert each stream into a corresponding spectrum. The spectra for each batch are stored in a corresponding set of locations in another section of memory designated by reference character 47, which may be considered to be functioning as a shift register. The spectra corresponding to a predetermined number of batches are stored in corresponding locations in the shift register with the older batch being overwritten as each new batch is processed.

As indicated previously, implementing a FIR filter by direct convolution can typically involve multiplying each amplitude sample in a time sequence by a corresponding coefficient. As is understood by those skilled in the art, a set of corresponding coefficients can be derived for the frequency domain. Such coefficients are stored in memory as indicated at block 48 which is designated the filter transform bank. The data in each stage in the shift register 47 is multiplied by the corresponding set of coefficients. The contributions thereby determined are summed as indicated at reference character 53.

An inverse fast Fourier transform is performed as indicated at block 55 to convert the filtered spectral data back to the time domain. This time domain data is then stored in memory acting as a buffer as indicated at block 57. As will be understood by those skilled in the art, the data stored in memory region 57 represents the contributions to the various output signals at a succession of points in time from input signals collected in a series of batches. The contributions to the output signals for successive output times are accessed sequentially, i.e., by a selector designated generally by reference character 59.

In the embodiment illustrated, the K output samples precalculated for each batch will be less than or equal to the G samples collected in each batch entered at block 43. When the data corresponding to the last precalculated output sample is read out, a new set is precalculated by the inverse fast Fourier transform 55 and loaded into the buffer 57.

During each sample interval, a direct convolution is performed on a set of recent samples, including the most recent, by the portion of the system indicated generally by reference character 60. As indicated previously the number of sample intervals covered by each set varies periodically.

Current samples are entered into a shift register 61. Direct filter coefficients, i.e., coefficients appropriate for the time domain rather than the frequency spectra domain, are stored in a section of memory designated by reference character 63 and these coefficients are applied to values stored in shift register 61 by multipliers designated by reference character 65. The contributions from the successive samples thereby calculated are then summed as indicated at reference character 67. The contributions obtained from the direct convolution section 60 are summed with those from the batch processing section 40 as indicated at block 71. Again, one or more output channels are provided as are one or more input channels with each output channel being derived from contributions from any and all of the input channels.

While the shift register 61 will contain the data from the most recent samples, the number of samples actually present in the shift register varies periodically. As each new set of batch data is transferred into the memory buffer 57, a number of locations in the shift register 61 equal to the number K of output samples precalculated for each batch are zeroed so that contributions from the older samples in the shift register 61 are effectively replaced by contributions obtained from the batch section 40. Thus, the number of sample intervals which are involved in establishing the contributions from the direct convolution section 60 will vary periodically in synchronism with the batching.

Figure 3:
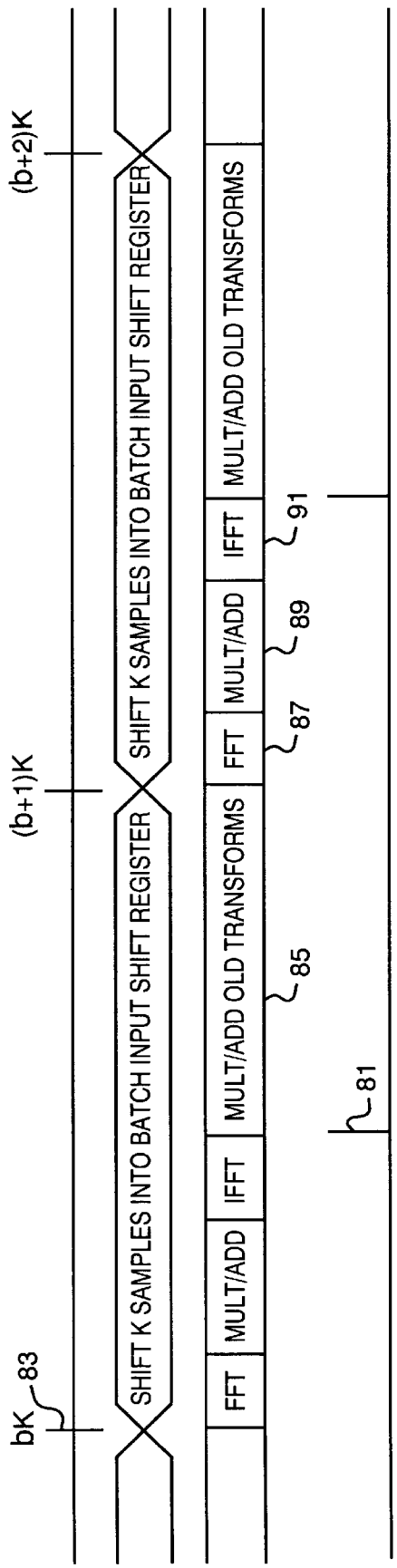
FIG. 3 is a timing diagram illustrating the operation of the filtering system of FIG. 2.

The sequence in which the parallel operations of the direct and batch sections take place is illustrated in FIG. 3. It is appropriate to start describing the on-going sequence of operations from the point, designated by reference character 81, at which a new set of data is transferred into the buffer 57 and the older elements stored in the shift register 61 are set to zero, even though the collection of a next batch of input samples would have started earlier as indicated by reference character 83. As described previously, several earlier batches will have been collected, converted to spectra and transferred into the spectra shift register 47, these being designated batch b-1 through batch b-R+1.

While the collection of the new batch, this batch being designated batch b, continues in the buffer 43, the older batches will have the corresponding coefficients applied from the memory bank 48 and will be accumulated to obtain a partial sum as indicated by reference character 85. During this same period new samples will continue to be entered into the direct convolution shift register 61 and an increasing number of positions in that shift register will be non-zero. Accordingly, a progressively increasing number of current sample contributions will be summed as indicated at 67 during each sample interval and combined as indicated at 71 with the contributions from the preceding collection of batches as stored in the buffer 57.

The progressive increasing of the number of contributions from the direct or immediate section 60 will continue through the time when the collections of samples into buffer 43 is completed. When a full batch of samples has been collected into the buffer 43, the fast Fourier transform will be applied, as indicated at reference character 87, the resulting spectra will be transferred to the corresponding location in the shift register 47, and the contribution from this most recent batch will be calculated by multiplication from the corresponding batch coefficients and added to the partial sum already formed as indicated by reference character 89. At this point, the accumulation of contributions in the batch processing section 40 is complete and the inverse fast Fourier transform is applied as indicated by reference character 91. When this is completed, the resultant time domain data is loaded into the buffer 57 and the older portions of the data in the shift register 61 are again reset.

As indicated previously, the number of non-zero elements in the shift register 61 increases progressively during the gathering of a batch of input samples by the batch section 40 and then returns to its initial value. Accordingly, if each output value were calculated as needed and separately from the others, the computational demand would grow progressively through the cycle. This is represented by the growing size of the block which represents the computational load in doing the direct convolution. However, it is actually advantageous to precalculate, at the same time the sample arrives, the contribution of each input sample to all of the output values to which it would contribute. Thus, in the preferred implementation, the computational load actually progressively decreases.

While the embodiments described implement batch processing in blocks of a single length, additional efficiency at the expense of additional complexity can be obtained by dividing larger blocks of data into smaller blocks with the calculations being performed on the basis of smaller increments. Such alternatives should be understood to be included within the scope of the present invention.

As indicated previously, the system of the present invention obtains much of the computational efficiency of a batch processing system while also obtaining the low latency necessary for real time control applications by a novel combination of immediate and batch processing resulting in an unconventional filter configuration.

While the filter system of the present invention is particularly useful for real time applications such as active vibration and noise control, it is also useful in other applications where low latency is desirable, e.g. in video image enhancing or in bandwidth compression.

Figure 4:
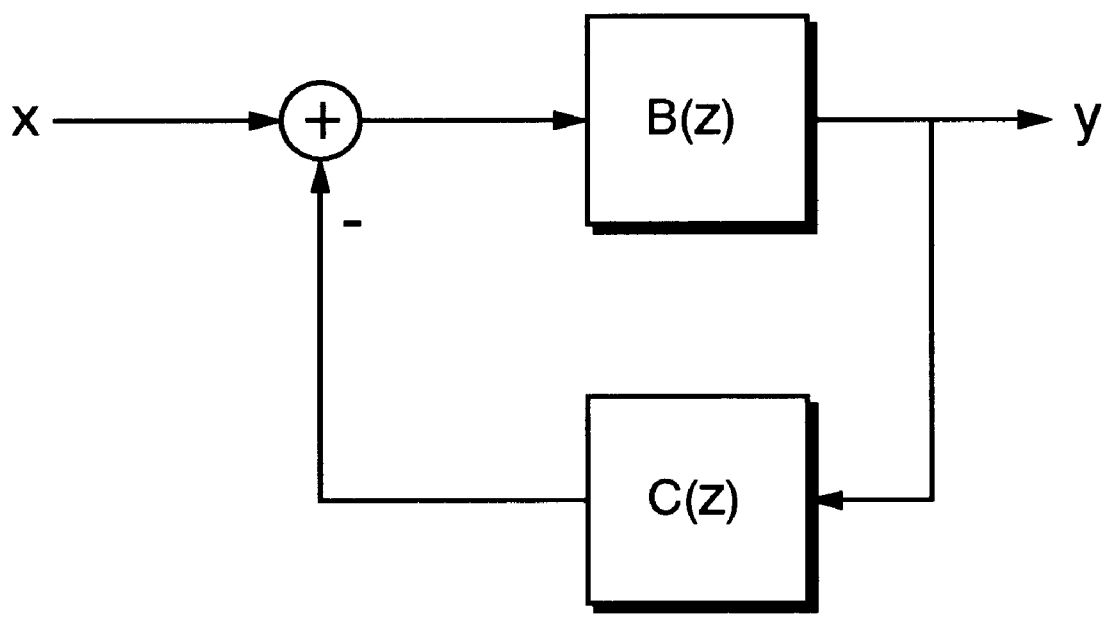
FIG. 4 is a block diagram illustrating a form of filter which can be implemented by means of the present invention.

While the techniques of the present invention may be implemented using special-purpose or dedicated circuitry as described with reference to FIG. 2, these techniques can also be implemented using arrays of programmable processors. A presently preferred system using the techniques of the present invention employs both a foreground multiprocessor subsystem (hereinafter referred to as the FMS) and a background multiprocessor system (hereinafter referred to as the BMS). The details of the implementation are described in greater detail hereinafter but for the purposes of the present, general explanation, it is useful to note that it implements a form of IIR filter structure of the type referred to herein as feedback neutralization which is illustrated in FIG. 4. As will be understood by those skilled in the art, the IIR filter structure depicted in FIG. 4 is just one of many possible filter structures that can be implemented in accordance with the principles of the present invention. The input/output relationship for the feedback neutralization filter structure depicted in FIG. 4 can be expressed as follows:

$$y(n) = \sum_{p=0}^{P-1} B(p)v(n-p) \quad (1)$$

$$v(n) = x(n) - \sum_{r=0}^{Q-1} C(r)y(n-r) \quad (2)$$

where B(p) is the coefficient for the pth tap for the forward filtering operation and C(r) is the coefficient for the rth tap on the feedback neutralization filtering operation, there being P taps on the forward operation and Q taps for the feedback neutralization operation. For separating the computation between the FMS and BMS, we define an index n as follows:

Let n=k+L+bK with k∈{0, . . . K−1} for each integer b; thus $y(n)=\dot{y}_b(k)+\ddot{y}_b(k)$ and $v(n)=r(n)-\dot{v}_b(k)-\ddot{v}_b(k)$ Accordingly, the contributions from the foreground calculations may be defined as follows:

$$\dot{y}_b(k) = \sum_{p=0}^{k+L} B(p)v(k+L+bK-p) \quad (3)$$

$$\dot{v}_b(k) = \sum_{r=0}^{k+L} C(r)y(k+L+bK-r). \quad (4)$$

Also accordingly, the contributions from the background calculations may be defined by:

$$\ddot{y}_b(k) = \sum_{p=k+L+1}^{P-1} B(p)v(k+L+bK-p) \quad (5)$$

$$\ddot{v}_b(k) = \sum_{r=k+L+1}^{Q-1} C(r)y(k+L+bK-r). \quad (6)$$

In Formulas 3, 4, 5, and 6, it should be understood that k is the index within a batch and b is the index of the batch. Referring to Formulas 5 and 6, it should be noted that $\ddot{y}_b(k)$ and $\ddot{v}_b(k)$ only depend upon data available before sample time bK; to compute y(k+L+bK) and v(k+L+bK), each $\ddot{y}_b(k)$ and $\ddot{v}_b(k)$ is needed by time k+L+bK.

The BMS delivers its results to the FMS in a batch-oriented fashion; specifically, for each integer b, the BMS delivers $\ddot{y}_b(k)$ and $\ddot{v}_b(k)$ for k=0, 1, . . . , K−1 by sample time L+bK. By sample time bK, all the data required to compute these $\ddot{y}_b(k)$ and $\ddot{v}_b(k)$ are available; however, the BMS may begin computing these $\ddot{y}_b(k)$ and $\ddot{v}_b(k)$ before time bK. Consequently, the BMS delivers a new batch of K results every K sample periods and these results are delivered no later than L sample periods following the arrival of the last required data.

At sample time bK, data arrives with which the FMS may begin to compute $\dot{y}_b(k)$ and $\dot{v}_b(k)$; by sample time k+L+bK, the FMS must complete this computation as well as the computation of $y(k+L+bK)=\dot{y}_b(k)+\ddot{y}_b(k)$ and $v(k+L+bK)=x(k+L+bK)−\dot{v}_b(k)−\ddot{v}_b(k)$ for k=0, . . . , K−1. Consequently, the FMS starts computing a new batch of K outputs every K sample periods and it must complete this computation within K+L periods of the time it begins this computation.

While the advantages of the present invention are greatest for large filters, i.e. those with a large number of taps, it is useful for purposes of explaining the sharing of computational load to describe a small filter.

Referring now to FIG. 5, the chart there illustrates the progressive shifting of contributions between the FMS and BMS. In this simplified example, the latency (L) is three, the batch size (K) is five, and the filter order (P) is eleven.

Consistent with the earlier explanation, it can be seen that the contribution from the FMS starts out with four elements at index k=0 and then progresses to eight elements at index k=4. Likewise, the number of samples which contribute through the BMS to each output value progressively decreases and then resets. Consistent with Equation 5, it can be seen that the contributions obtained through the BMS proceed as follows. For index k=0, there are seven samples contributing, whereas for index k=4, there are three samples contributing.

In this simplified explanation, only the contributions from the input sampling with coefficients B(p) are shown but it will be understood that, if needed, the calculation for the contributions from the feedback path with coefficients C(r) is also shared between the FMS and BMS in essentially similar manner.

Figure 6:
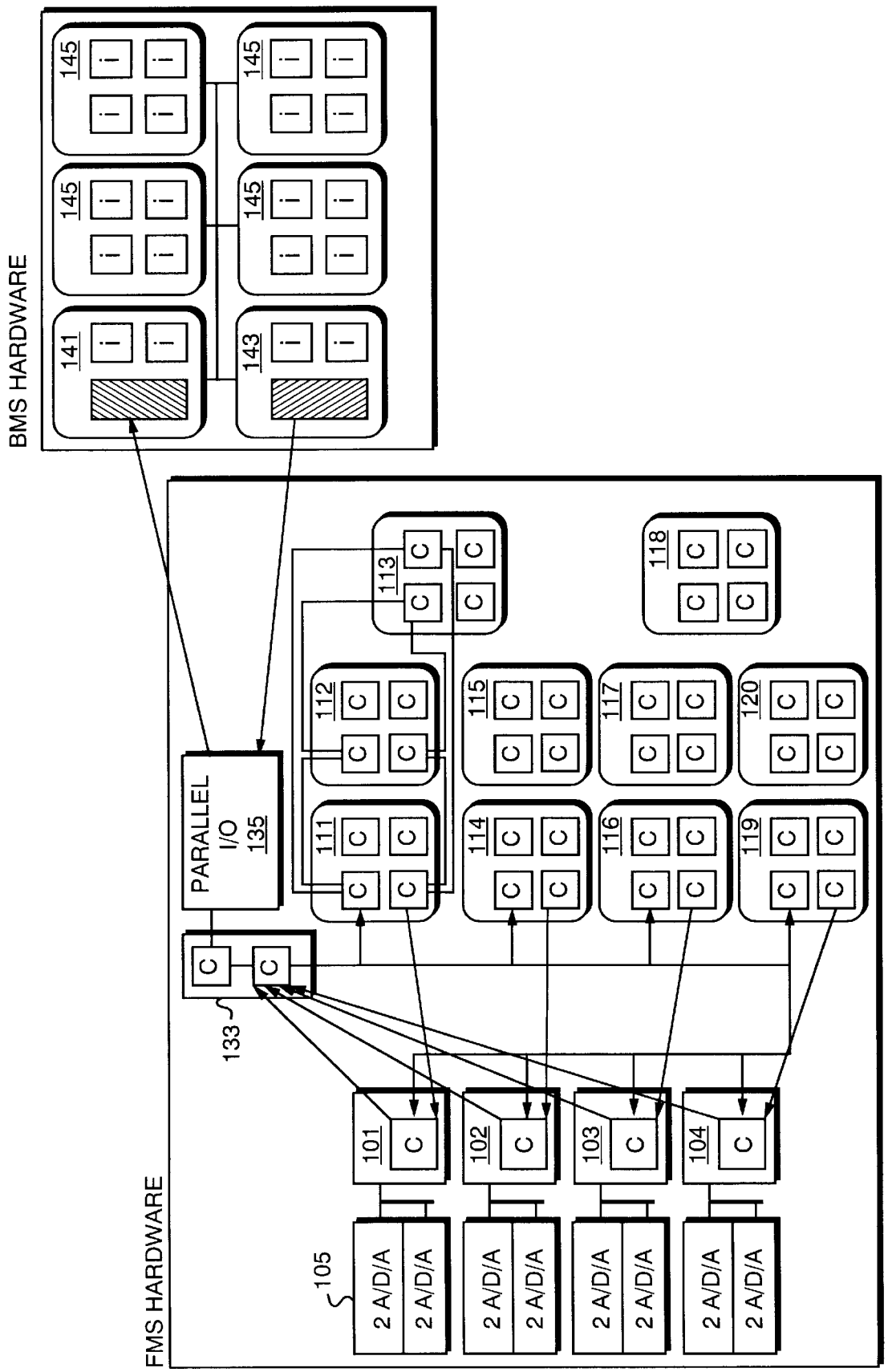
FIG. 6 is a block diagram of a system in accordance with the present invention implemented with arrays of microprocessors.

A particular implementation of the FMS/BMS implementation is illustrated in somewhat greater detail in FIG. 6. The system of FIG. 6 is implemented largely using commercially available off-the-shelf (COTS) components. In general, the FMS is implemented using signal processing microprocessors, i.e. the Model TMS320C40 (hereinafter "C40s") available from Texas Instruments Corporation of Dallas, Tex., while the BMS is implemented using more general-purpose microprocessors, i.e. the Model i860 microprocessor available from Intel Corporation of Sunnyvale, Calif. In a practical application for vibration control, a system of this type was configured to generate fifteen output data streams from ten input data streams using filter order coefficients (taps) of P=1536 and Q=2048.

Four of the C40 processors, 101–104, are utilized to handle input/output tasks in connection with the analog sensor input and transducer output signals and, to this end, each of those C40s manages up to four A/D/A channels 105. These four C40 processors (101–104) also compute contributions from the five most recent samples for combining with contributions from older samples from both other elements of the FMS and from the BMS.

The balance of the computation capability of the FMS is provided by an array of 40 C40 processors which are grouped four to each of ten cards 111–120 which are linked through several high-speed "COMM" ports (which are standard components of the C40 processor) with the I/O processors 101–104. Two further C40 processors 133 are utilized to control a parallel I/O interface 135 which communicates with an array of 20 Intel i860 processors. Two of the i860 processors (141) operate as an input master while another two (143) operate as an output master. The remaining 16 i860s designated by reference character 145 are operated as slaves to these masters.

The input master is responsible for gathering each new batch of K input samples from the FMS and computing the forward FFT's; it then delivers this transformed data to the slave processors. The slave subgroup performs the bulk of the computation; each processor in this subgroup is responsible for computing the contributions for just a few transformed values. The output master is responsible for gathering the results from the slave processors and computing the inverse FFT's. It then delivers the results, $\ddot{y}_b(k)$ and $\ddot{v}_b(k)$ for k=0, 1, . . . , K−1, to the FMS.

Figure 7:
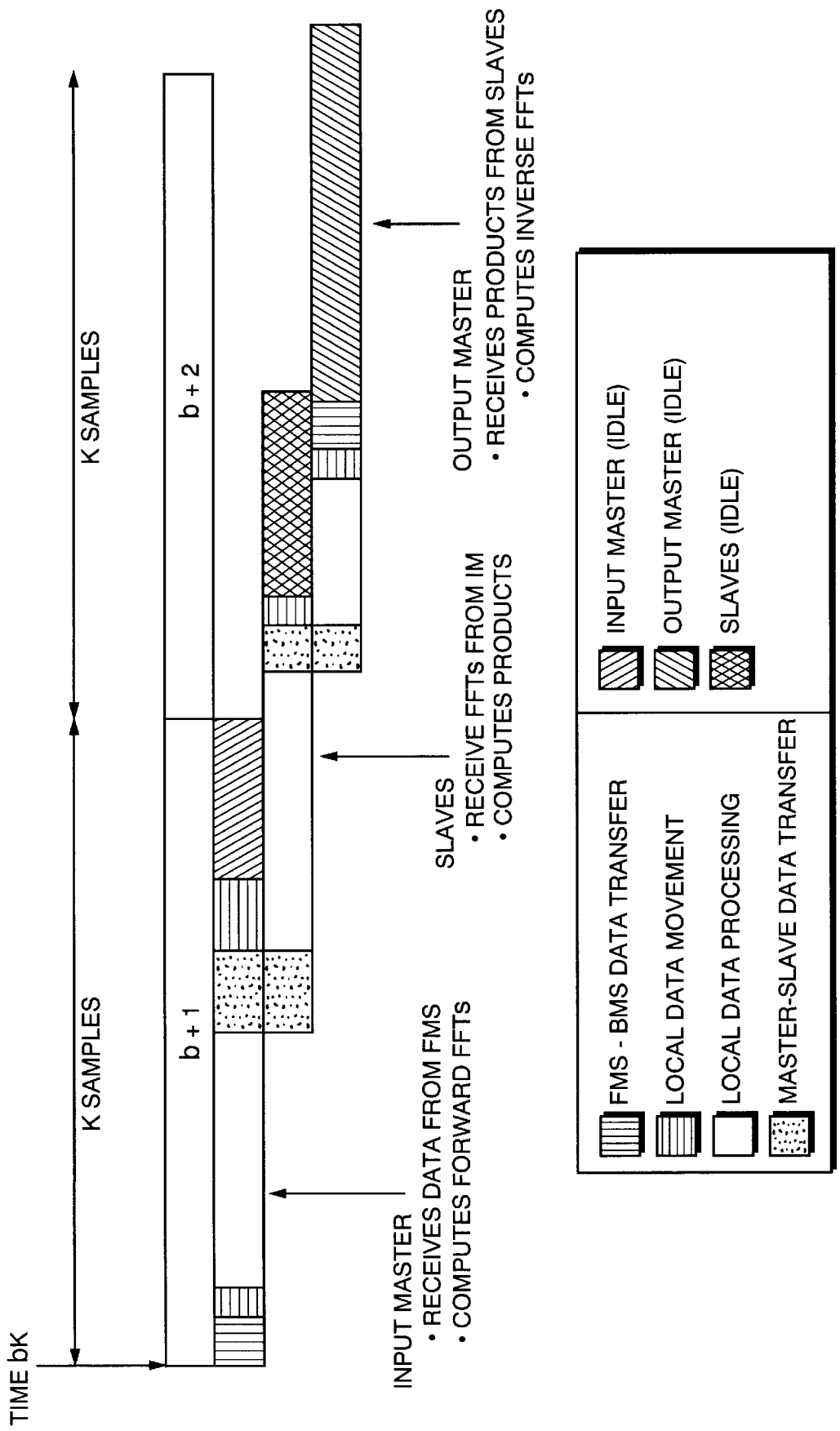
FIG. 7 is a timing diagram illustrating the sequencing of operations in the system of FIG. 6.

FIG. 7 illustrates typical scheduling for these operations.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A method of generating with low latency an output data stream as a filtered function of an input data stream of successive data samples generated at predetermined intervals and including most recent data samples and earlier occurring data samples, said method comprising the steps of:

during each interval, applying corresponding filter coefficients to a determined number of the most recent data samples to define a contribution from each of said data samples to a current value of said output data stream, said determined number being incremented progressively during successive intervals up to a preselected maximum number at which point the determined number is reset to a preselected starting value;

over a substantial number of said intervals less than said maximum number, performing the substeps of:
1) converting a large number of the earlier occurring data samples into a respective frequency spectra;
2) applying corresponding frequency domain filter coefficients to said frequency spectra; and
3) converting said filtered frequency spectra to time domain data defining a contribution from said frequency spectra to a later value of said output data stream; and during each interval, combining the contributions from the most recent data samples and from the frequency spectra to the current value of the output data stream.

2. The method as set forth in claim 1, wherein the applying step includes the substeps of:

entering said input data stream into a shift register; and applying said corresponding filter coefficients to the contents of respective shift register positions.

3. The method as set forth in claim 1, wherein the converting a large number of data samples substep includes the substeps of:

converting batches of said earlier occurring data samples to respective spectra; and storing the converted batches in respective spectra shift registers; and wherein the applying substep includes the substep of:

applying the corresponding frequency domain coefficients to the contents of respective spectra shift register positions.

4. The method as set forth in claim 2 or claim 3, wherein the applying of corresponding filter coefficients to a determined number of most recent samples is performed by a first array of processors and the applying of frequency domain coefficients to said frequency spectra is performed by a second array of processors.

5. The method as set forth in claim 4, wherein said first array of processors comprises digital signal processors and said second array of processors comprises general purpose programmable processors.

6. In a control system having one or more sensors, each of which provides a respective input stream of successive data samples generated at predetermined intervals and including most recent data samples and earlier occurring data samples, and one or more output transducers which respond to respective output data streams, a method of generating said output data streams as a filtered function of said input data streams, said method comprising the steps of:

during each interval, applying corresponding filter coefficients to a determined number of the most recent data samples to define a contribution from each of said data samples to a current value of each of said output data streams, said determined number being incremented progressively during successive intervals up to a preselected maximum number at which point the determined number is reset to a preselected starting value;

over a substantial number of said intervals less than said maximum number, performing the substeps of:
1) converting a large number of the earlier occurring data samples into a respective frequency spectra;
2) applying corresponding frequency domain filter coefficients to said frequency spectra; and
3) converting said filtered frequency spectra to time domain data defining a contribution from said frequency spectra to a later value of each of said output data streams; and during each interval, combining the contributions from the most recent data samples and from the frequency spectra to the current values of the output data streams, thereby generating output data streams which are based on essentially current input data samples as well as older input data samples.

7. In a control system having one or more sensors, each of which provides a respective input stream of successive data samples generated at predetermined intervals and including most recent data samples and earlier occurring data samples, and one or more output transducers which respond to respective output data streams, an apparatus for generating said output data streams as a filtered function of said input data streams, said apparatus comprising:

means for applying, during each interval, corresponding filter coefficients to a determined number of the most recent data samples to define a contribution from each of said data samples to a current value of each of said output data streams, said determined number being incremented progressively during successive intervals up to a preselected maximum number at which point the determined number is reset to a preselected starting value;

means for, over a substantial number of said intervals less than said maximum number:
converting a large number of the earlier occurring data samples into a respective frequency spectra;
applying corresponding frequency domain filter coefficients to said frequency spectra; and
converting said filtered frequency spectra to time domain data defining a contribution from said frequency spectra to a later value of each of said output data streams; and means for combining, during each interval, the contributions from the most recent data samples and from the frequency spectra to the current values of the output data streams, thereby generating output data streams which are based on essentially current input data samples as well as older input data samples.

8. The apparatus as set forth in claim 7, wherein the means for applying includes:
a shift register;
means for entering said input data stream into the shift register; and
means for applying said corresponding filter coefficients to the contents of respective shift register positions.

9. The apparatus as set forth in claim 7, wherein the means for converting a large number of the earlier occurring data samples includes:
a plurality of spectra shift registers;
means for converting batches of said earlier occurring data samples to respective spectra; and
means for storing the converted batches in respective ones of the spectra shift registers; and
wherein the means for applying corresponding frequency domain coefficients includes:
means for applying the corresponding frequency domain coefficients to the contents of respective spectra shift register positions.

10. The apparatus as set forth in claim 9, wherein the means for applying corresponding filter coefficients to a determined number of most recent samples includes a first array of processors and the means for applying frequency domain coefficients to said frequency spectra includes a second array of processors.

11. The apparatus as set forth in claim 10, wherein said first array of processors comprises digital signal processors and said second array of processors comprises general purpose programmable processors.

12. A control system comprising:
a plurality of sensors, each of the sensors providing a respective input stream of successive data samples generated at predetermined intervals and including most recent data samples and earlier occurring data samples;
a plurality of output transducers, each of the transducers responding to respective output data streams;
a direct convolution section that applies, during each interval, corresponding filter coefficients to a determined number of the most recent data samples to define a contribution from each of said data samples to a current value of each of said output data streams, said determined number being incremented progressively during successive intervals up to a preselected maximum number at which point the determined number is reset to a preselected starting value;
a batch processing section that, over a substantial number of said intervals less than said maximum number, converts a large number of the earlier occurring data samples into a frequency spectra, applies corresponding frequency domain filter coefficients to said frequency spectra, and converts said filtered frequency spectra to time domain data defining a contribution from said frequency spectra to a later value of each of said output data streams; and a summation section that combines, during each interval, the contributions from the most recent data samples and from the frequency spectra to the current values of the output data streams, thereby generating output data streams which are based on essentially current input data samples as well as older input data samples.

* * * * *